United States Patent [19]

Pham et al.

[11] Patent Number: 5,223,682
[45] Date of Patent: Jun. 29, 1993

[54] ARC-DETECTING CIRCUIT BREAKER

[75] Inventors: Van Doan Pham; Joseph Martin, both of Meyzieu; Jean-Pierre Dupraz, Lyons, all of France

[73] Assignee: GEC Alsthom SA, Paris, France

[21] Appl. No.: 793,941

[22] Filed: Oct. 22, 1991

[30] Foreign Application Priority Data

Oct. 22, 1990 [FR] France .................. 90 13049

[51] Int. Cl.⁵ ........................................ H01H 33/26
[52] U.S. Cl. ........................ 200/148 R; 200/148 B; 307/139
[58] Field of Search ........... 200/148 R, 148 A, 148 B; 361/1, 115, 16, 174; 307/139

[56] References Cited

U.S. PATENT DOCUMENTS

| | | | |
|---|---|---|---|
| 4,513,208 | 4/1985 | Kamata | 307/139 |
| 4,532,499 | 7/1985 | Collin et al. | 200/148 R X |
| 5,072,083 | 12/1991 | Thuries et al. | 200/148 A |
| 5,089,931 | 2/1992 | Thuries et al. | 361/174 |

FOREIGN PATENT DOCUMENTS

| | | |
|---|---|---|
| 3337553 | 4/1984 | Fed. Rep. of Germany . |
| 3542550 | 11/1986 | Fed. Rep. of Germany . |
| 2640386 | 6/1990 | France . |
| 2-181668 | 7/1990 | Japan . |

OTHER PUBLICATIONS

French Search Report; Aug. 1991.
Journal of Lightwave Technology, vol. 7, No. 7 Jul. 1989, N.Y., pp. 1029–1032 K. Muto: "Electric-Discharge Sensor Utilizing Fluorescent Optical Fiber".

*Primary Examiner*—J. R. Scott
*Attorney, Agent, or Firm*—Sughrue, Mion, Zinn, Macpeak & Seas

[57] ABSTRACT

A circuit-breaker including at least one insulating interrupting chamber inside which there are contacts and a blast nozzle. The insulating interrupting chamber is placed on an insulating support containing a drive rod. The circuit-breaker further includes a first terminal and a second terminal. The circuit-breaker has at lest one fluorescent or scintillating optical fiber disposed inside the support and constituting a symmetrical loop around the drive rod. Each end of the fiber is connected to a photodiode equipped with an amplifier. Light propagated in the interrupting chamber, as a result of arcing, reaches the optical fiber loop via a light passage within a terminal of the interrupting chamber remote from the arcing zone within the interrupting chamber.

8 Claims, 2 Drawing Sheets

ARC-DETECTING CIRCUIT BREAKER

The present invention relates to a circuit-breaker in which means are provided for detecting the appearance of an electric arc, measuring the duration thereof and evaluating the intensity of the corresponding current.

BACKGROUND OF THE INVENTION

By finding out such parameters, it is possible to assess contact wear and to verity that the circuit-breaker is operating properly. Such monitoring of the state of the circuit-breaker enables maintenance to be planned and operating faults to be avoided.

The invention is based on the use of fluorescent fibers. In French Patent No. 2,640,386, the Applicant shows that it is possible to use fluorescent optical fibers to detect discharge light, whether visible or not, in equipment enclosed in a metal case.

Document JP-A-02 181668 shows how a looped fiber inside an enclosure may be used to detect the appearance of an arc due to a fault. A drawback of that described apparatus is that the fiber is immediately destroyed when the first fault appears. This is unimportant in the case of an electrical enclosure which, in any event, must be repaired after the fault, but that teaching cannot be used to detect the appearance of an arc in the interrupting chamber of a circuit-breaker that is required to operate hundreds of times over.

An object of the invention is to implement optical fiber arc-detecting apparatus which does not require the fiber to be replaced every time an arc appears.

SUMMARY OF THE INVENTION

To be more precise, the invention provides a high-tension circuit-breaker including at least one interrupting chamber per phase, which chamber is filled with a dielectric gas under pressure, and inside which chamber there are main contacts, arcing contacts, means for blasting the arc by compressing the gas through a blast nozzle, said insulating chamber being placed on an insulating support containing a drive rod, said circuit-breaker including a first terminal near a first end of the chamber and a second terminal between a second end of the chamber and said support, said circuit-breaker including at least one fluorescent optical fiber, wherein said fiber is disposed inside said support and constitutes a symmetrical loop around said drive rod, each end of said fiber being connected to a photodiode equipped with an amplifier, the amplifiers having different sensitivities, said second terminal being equipped with openings enabling said fiber to receive at least a portion of the light flux emitted by the arcs that occur in said interrupting chamber.

BRIEF DESCRIPTION OF THE DRAWINGS

Embodiments of the invention are described by way of example with reference to the accompanying drawings, in which.

DETAILED DESCRIPTION

Figure 1:
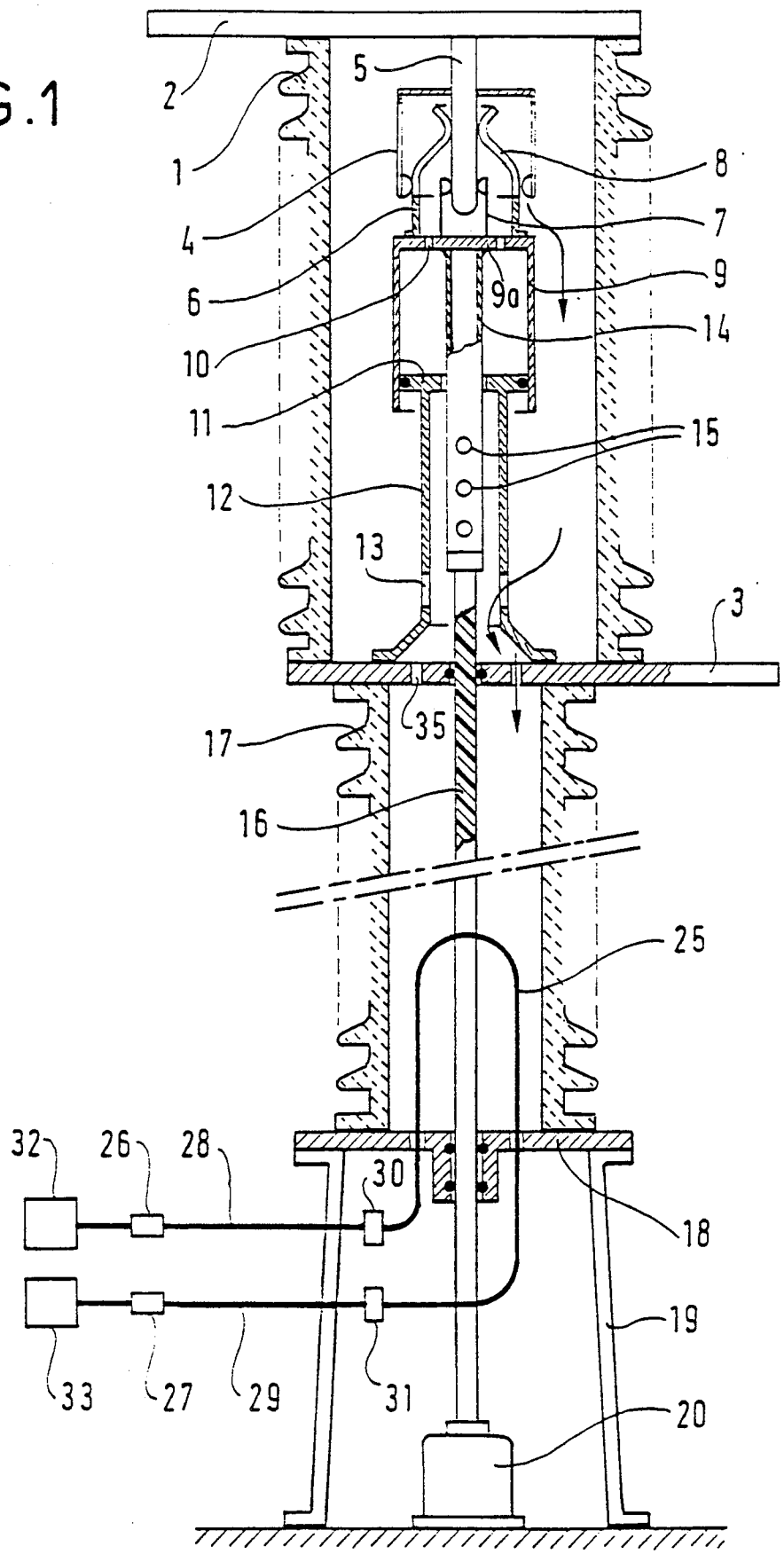
FIG. 1 is an elevation view of one phase of a circuit-breaker having one interrupting chamber per phase.

In FIG. 1, reference 1 designates an insulating case delimiting an interrupting chamber of a circuit-breaker having one interrupting chamber per phase. The case is closed at its top by a first plate 2 constituting a first terminal, and at its bottom by a second plate constituting a second terminal 3.

Inside the interrupting chamber, there are contact fingers 4 constituting the fixed main contact, a fixed arcing contact 5, a tube 6 constituting a moving main contact, contact fingers 7 constituting the moving arcing contact, and a blast nozzle 8.

The moving contacts 6, 7 are fixed to a moving cylinder 9 having through 10 in its bottom 9a to allow the arc-blasting gas to pass therethrough. A piston 11 is fixed to the plate 3 by a tube 12. The tube 12 has through holes 13 to allow the gas to circulate. The end of the moving cylinder 9 is fixed to a tube 14 which has through holes 15 and which is connected to a drive rod 16 made of an insulating material.

The insulating rod passes through the plate 3 and extends inside a column 17 which is made of an insulating material and which serves as a support for the interrupting chamber 1. The bottom of the support 17 is closed in gastight manner by a bottom 18 supported by a metal structure 19. The rod 16 passes through the bottom 18 in gastight manner and is connected to a drive mechanism 20.

The chamber 1 and the support 17 are filled with a dielectric gas under pressure, e.g. sulfur hexafluoride SF]6[.

In the invention, a fluorescent optical fiber is disposed inside the support 17, so as to constitute a symmetrical loop having its two strands passing through the bottom 18 in gastight manner and having its two ends connected to photodiodes 26 and 27, either directly or, as shown in FIG. 1, by means of transparent plastic fibers 28, 29 associated with optical connector components 30 and 31. The outputs of the photodiodes are connected to amplifiers 32, 33 having different sensitivities, e.g. in a ratio of 2 to 1.

Operation is as follows.

When the circuit-breaker is opened by driving the rod 16, the moving arcing contact 7 losses contact with the fixed arcing contact 5, and an arc is struck between these contacts. A large portion of the hot gases escapes via the openings 15 and 13. As shown by the arrows, FIG. 1, the light from the arc passes through holes 13 in the tube 12 and through holes 35 which are small in diameter provided in the plate 3. The fact that the holes 35 are small in diameter prevents the hot gas from penetrating into the support column 17, but does not prevent the light from entering therein. The side surface of the optical fiber 25 picks up the light. Measurement is highly sensitive because the light is picked up over the whole length of the fiber, which may be several tens of centimeters long. This does not apply to silica fiber which is not suitable because of its small section. The symmetrical shape given to the fiber ensures that each strand receives an equal quantity of light. The fiber may be positioned accurately by calibrating the apparatus with identical amplifiers 32 and 33. Once the apparatus has been adjusted, amplifiers having different sensitivities are chosen so as to classify arcs into two intensity ranges.

Figure 2:
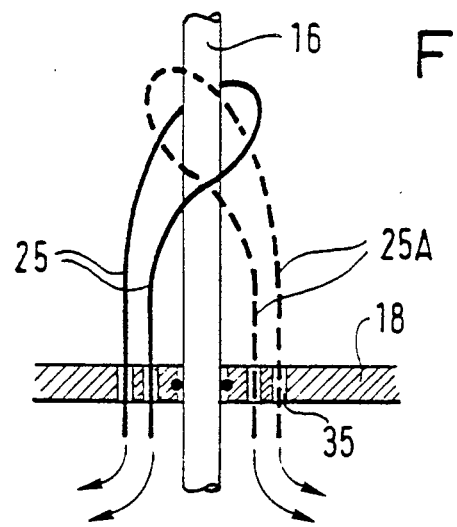
FIG. 2 shows the disposition of two optical fibers in a chamber.

In the variant embodiment shown in FIG. 2, two mutually symmetrical loops 25 and 25A are used, thereby enabling arcs to be classified into four intensity ranges by means of appropriate amplifiers.

Figure 3:
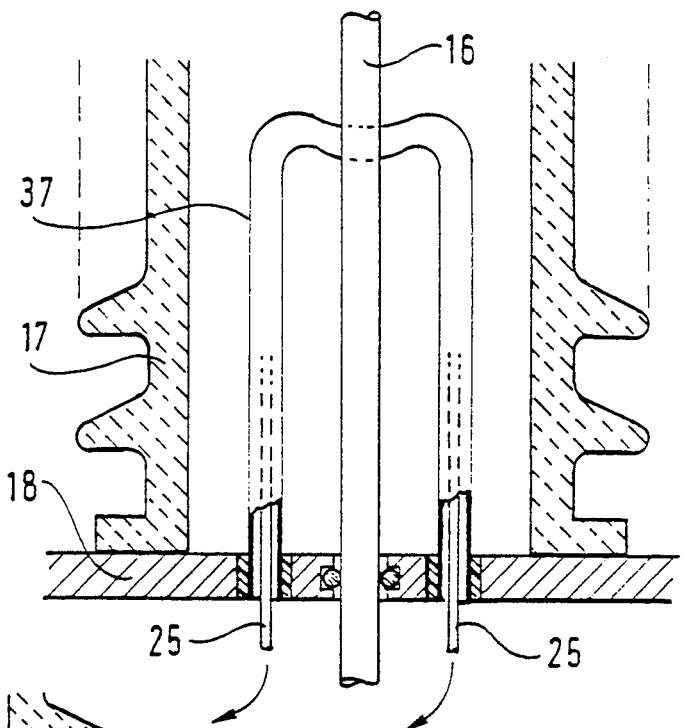
FIG. 3 shows a variant embodiment in which the optical fiber is protected by a transparent tube.

In the variant embodiment of FIG. 3, the fiber 25 is disposed inside a transparent tube 37 placed inside the support 17. The tube is preferably in the shape of an upside down U. The tube contains atmospheric air but is sealed against the dielectric gas. The two branches of the tube are parallel to the insulating rod 16. The top of the tube goes round the insulating rod 16. This disposition has the advantage both of making it easier to replace a damaged optical fiber without disassembling the apparatus, and also of avoiding putting the fluorescent fiber in contact with the dielectric gas and with the decomposition products due to the arc that may penetrate into the support 17 despite the precautions taken to prevent that happening.

Figure 4:
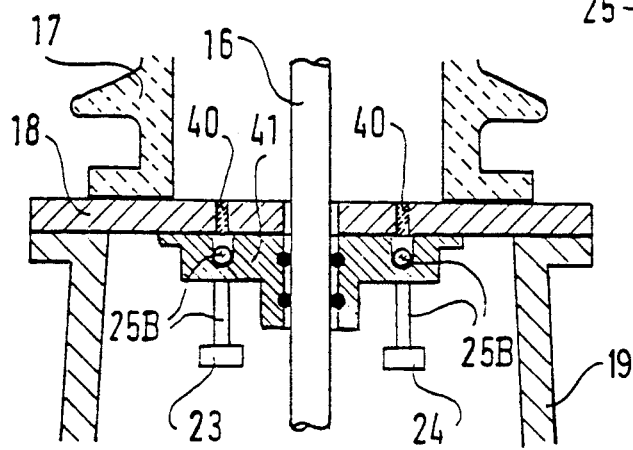
FIG. 4 shows another variant in which the optical fiber is placed outside the insulating support of the interrupting chamber.

In the variant embodiment FIG. 4, the fiber 25B is placed in the atmospheric air outside the support 17. The plate 18 is equipped with a plurality of transparent windows 40 which are small in diameter and which are sealed against the dielectric gas.

The fiber 25B is placed behind the windows in a closed dark enclosure 41. The two ends of the fiber 25B are connected to photodiodes 23 and 24 as above.

The above-mentioned fluorescent optical fibers may, for certain applications, be replaced by scintillating fibers.

It should be noted that all the holes 35 together need only have a cumulative overall surface area of 1 square centimeter for the optical fiber to receive enough light.

The invention enables the number of arcs that occur during operation of a circuit-breaker to be measured accurately. It is possible to determine, with good accuracy, the duration of each arc both at contact opening and at contact closing, and also the intensity ranges corresponding to these arcs, and to draw up a plan for circuit-breaker maintenance so as to avoid untimely breakdowns. The optical fiber used is kept away from the hot gases and therefore repeatedly provides accurate values. When a malfunction leads to an arc of duration that is too long (e.g. non-interruption of a low current), this detection technique enables the protection system to take the necessary steps for protecting the installation.

The invention applies to circuit-breakers both of the ceramic case type and of the metal case type. In a circuit-breaker having a metal case, the fiber is mounted in the single-phase tank, behind the drive rod.

We claim:

1. A high-tension circuit-breaker including at least one interrupting chamber per phase, said interrupting chamber having a first end and a second end and being filled with a dielectric gas under pressure, said interrupting chamber having internally main contacts, arcing contacts and means for blasting an arc by compressing said gas through a blast nozzle, said interrupting chamber being placed on an insulating support containing a drive rod, said circuit-breaker further including a first terminal near said first end of said interrupting chamber and a second terminal between said second end of said interrupting chamber and said support, said circuit-breaker further including at least one optical fiber disposed inside said support and constituting a symmetrical loop around said drive rod, said optical fiber having opposite ends, each end being connected to a respective photodiode equipped with an amplifier, said amplifiers having different sensitivities, and said second terminal including light transmitting openings such that a part of the light emitted by an arc during a switch off operation of the circuit breaker propagates from an arcing zone inside said interrupting chamber and reaches the inside of said support via said openings in said second terminal thereby enabling said optical fiber to receive at least a portion of the light flux emitted by the arc occurring in said interrupting chamber.

2. A circuit-breaker according to claim 1, wherein a second optical fiber is mounted symmetrically relative to the first fiber.

3. A circuit-breaker according to claim 1, wherein said optical fiber is placed inside a transparent tube sealed off from hot gases created by said arc reaching the interior of said support.

4. A circuit-breaker according to claim 1, wherein said optical fiber is a scintillating optical fiber.

5. An optical fiber according to claim 1, wherein said optical fiber is a fluorescent optical fiber.

6. A high-tension circuit-breaker including at least one interrupting chamber per phase, said interrupting chamber having a first end and a second end and being filled with a dielectric gas under pressure, said interrupting chamber having internally main contacts, arcing contacts and means for blasting an arc by compressing the gas through a blast nozzle, said interrupting chamber being placed on an insulating support containing a drive rod, said circuit-breaker further including a first terminal near said first end of said interrupting chamber and a second terminal between said second end of said interrupting chamber and said support, said circuit-breaker including at least one optical fiber, said optical fiber being disposed outside of said support, behind a plate of said support closing off an end of said support remote from said interrupting chamber, and said plate being equipped with transparent windows proximate to a loop of said optical fiber extending symmetrically around said drive rod, with said windows of said plate facing portions of said loop to opposite sides of said drive rod, each end of said optical fiber being connected to a respective diode and wherein a part of the light emitted by an arc during a switch off operation of the circuit-breaker propagates from an arcing zone inside said interrupting chamber and reaches the inside of said support via light transmitting openings in said second terminal and illuminating said optical fiber loop via said transparent windows.

7. A circuit-breaker according to claim 6, wherein said optical fiber is a scintillating optical fiber.

8. A circuit-breaker according to claim 6, wherein said optical fiber is a fluroescent optical fiber.

* * * * *